United States Patent [19]

Madanshetty

[11] Patent Number: 5,681,396
[45] Date of Patent: Oct. 28, 1997

[54] METHOD AND APPARATUS FOR UTILIZING ACOUSTIC COAXING INDUCED MICROAVITATION FOR SUBMICRON PARTICULATE EVICTION

[75] Inventor: Sameer I. Madanshetty, Cambridge, Mass.

[73] Assignee: Trustees of Boston University, Boston, Mass.

[21] Appl. No.: 665,818

[22] Filed: Jun. 19, 1996

Related U.S. Application Data

[63] Continuation of Ser. No. 379,308, Jan. 27, 1995, abandoned.
[51] Int. Cl.$^6$ .................................................. B08B 3/12
[52] U.S. Cl. ........................... 134/1.3; 134/184; 134/902
[58] Field of Search .............................. 134/1, 1.3, 113, 134/184, 902; 422/20

[56] References Cited

U.S. PATENT DOCUMENTS

| | | | |
|---|---|---|---|
| 3,608,715 | 9/1971 | Snyder et al. | 209/590 |
| 3,614,069 | 10/1971 | Murray | 366/119 |
| 4,369,100 | 1/1983 | Sawyer | 204/157.42 |
| 4,689,986 | 9/1987 | Carson et al. | 73/19.03 |
| 4,979,994 | 12/1990 | Dussault et al. | 134/1 |
| 5,198,122 | 3/1993 | Koszalka et al. | 210/748 |
| 5,219,401 | 6/1993 | Cathignol et al. | 128/660.03 |
| 5,247,954 | 9/1993 | Grant et al. | 134/1 X |
| 5,355,048 | 10/1994 | Estes | 310/334 |
| 5,393,417 | 2/1995 | Cox | 210/96.1 |
| 5,523,058 | 6/1996 | Umemura et al. | 134/1 X |

OTHER PUBLICATIONS

Berg, D.M. et al., (1989) "New Sonic Cleaning Technology for Particle Removal From Semiconductor Surfaces" *Particles on Surfaces–2: Detection, Adhesion and Removal from Semiconductor Surfaces* Ed. K.L. Mittal, Plenum Press, New York.

*Primary Examiner*—Jill Warden
*Assistant Examiner*—Saeed Chaudhry
*Attorney, Agent, or Firm*—Baker & Botts,L.L.P.

[57] ABSTRACT

The invention relates to the surgical cleaning of a semiconductor wafer through the inducement of cavitation on the surface of the wafer at the location of an adherent particle. Cavitation is induced by focusing two acoustic fields on the surface of the wafer. The two acoustic fields include a cavitation field having relatively low frequency focused on the wafer surface from a direction perpendicular to the wafer and a coaxing field of relatively high frequency focused on the wafer surface form a direction between 0 and 25 degrees from the wafer surface.

18 Claims, 5 Drawing Sheets

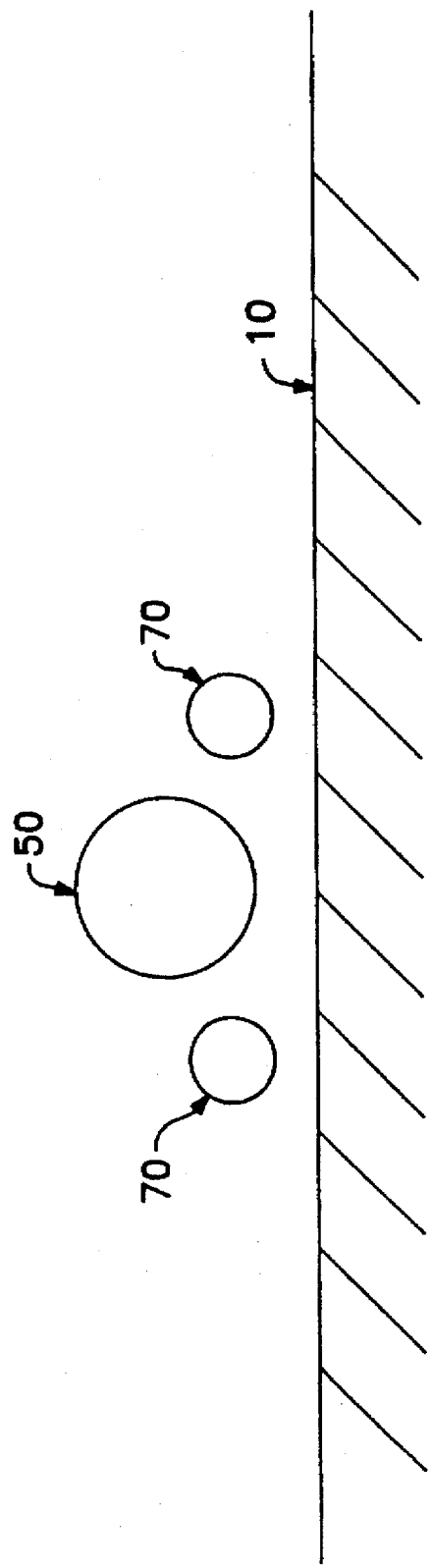

METHOD AND APPARATUS FOR UTILIZING ACOUSTIC COAXING INDUCED MICROAVITATION FOR SUBMICRON PARTICULATE EVICTION

The application is a continuation of application Ser. No. 08/379,308, filed Jan. 27, 1995 now abandoned.

BACKGROUND

1. Field of the Invention

This invention relates to the cleaning of silicon wafers used in semiconductor fabrication. More specifically, this invention relates to the use of ultrasonic induced cavitation to clean submicron sized particles from the surface of a silicon wafer.

2. Background of the Invention

During semiconductor fabrication wafers must be kept extremely clean. Any particulate contamination larger than one third of the line width scale (the width of the smallest feature on a wafer) may cause a fault in the circuit ultimately fabricated on a wafer. There are generally two sources of particulate contamination: airborne particles and liquid-borne particles. Although improvements in air filtration technology used in clean rooms has reduced the contamination due to airborne particles to an acceptable level, contamination from liquid-borne particles still persists. Liquid-borne particles are generated at every step of the wafer fabrication process. Use of ultra-pure chemicals-and point-of-use filtration techniques during the fabrication process has reduced the level of contamination due to liquid-borne particles, but have failed to eliminate the need for wafer cleaning. In fact, wafer cleaning is still the most frequently repeated step in any semiconductor fabrication process.

Presently used wafer cleaning methods include: mechanical scrubbing (i.e. using high energy sprays or rotating brushes), ultrasonic tank cleaning, focused acoustic cleaning and megasonic cleaning. Mechanical scrubbing is ineffective for submicron scale contamination. Further, there is no guarantee that such scrubbing will be effective at any scale. Ultrasonic tank cleaning is no longer a favored process because the distribution of sonic energy in the tanks is uneven. This may lead to "hot spots" on the dipped wafers and consequent circuit damage and stacking faults.

Prior art focused acoustic cleaning relies on producing cavitation at a wafer surface for its cleaning. These systems generally operate at frequencies around 20 kHz which gives rise to a wavelength of about 7.5 cm. These systems are ineffective for two reasons. First the wavelength is disproportionately long and therefore does not interact well with submicron sized particles. Second, at 20 kHz the resonance radius of an air bubble in water is about 0.16 mm (resonance radius in µm=3.2/(insonification frequency in MHz)). At this scale the cavitation thresholds are weak and cavitation activity is sporadic and uncontrolled. Cleaning is therefore ineffective since every particle will not necessarily give rise to cavitation. Further, uncontrolled cavitation may damage the wafer.

Megasonic cleaning operates at a frequency of about 1 MHz, with the transducer tangentially sweeping the wafer surface being cleaned. Megasonic cleaners may operate in a continuous wave mode or a pulse mode by using pulses of increased intensity (i.e., the reciprocity principal holds true as shown by Berg et at., *New Sonic Cleaning Technology For Particle Removal From Semiconductor Surfaces*). Megasonic cleaning relies on shearing forces induced by streaming flow for cleaning and not on cavitation. Therefore, megasonic cleaning is ineffective in dislodging particles trapped in deep structures on a wafer surface.

The above wafer cleaning methods rely on mechanical force for detaching particles. The main limitation of these methods is they are ineffective at removing submicronic particles which strongly adhere to the wafer surface due to increased van der Waal attraction.

SUMMARY OF THE INVENTION

Therefore, a need has arisen for a wafer cleaning method which is effective at cleaning submicron sized particles from the surface of a wafer.

Accordingly, it is an object of the present invention to provide a method and an apparatus for cleaning the surface of a wafer which is effective on submicron sized particles.

It is a further object of the present invention to provide a method and an apparatus for substantially simultaneous cleaning and inspection of the surface of a wafer.

The objects of the present invention are generally achieved by inducing cavitation at the surface to be cleaned by confocally arranging two ultrasonic fields on the surface of the wafer.

In one embodiment, the surface of a wafer is cleaned and inspected substantially simultaneously. Two ultrasonic fields are used to induce controlled cavitation. In a first step, gas caps are formed on particles present on a wafer surface by application of a first pulsed ultrasonic field having a relatively high frequency. The gas caps are formed in part by the agglomeration of nano-gas-dots which are extremely small (i.e. nano scale) gas pockets present on particles. The gas caps are separated from the particles by application of a second pulsed ultrasonic field of relatively low frequency (in comparison to the first ultrasonic source). The separation of the gas caps dislodges the particles from the surface of the wafer allowing them to be swept away by the streaming flow of the high frequency field. Inspection is carried out in the interval between pulses by a process such as, for example, pulse-echo scattering or optical detection.

An embodiment of an apparatus for simultaneously cleaning and inspecting the surface of a wafer includes the use of two pulsed ultrasound sources to induce controlled cavitation. The first pulsed source is a relatively high frequency source focused on the surface of the wafer from a direction between 0 and 25 degrees from the surface of the wafer. This first source induces gas caps to form on particles on the wafer. The second pulsed ultrasound source is a relatively low frequency source (compared to the high frequency source), focused on the surface of the wafer from a direction substantially perpendicular to the surface of the wafer to be cleaned. This second source separates the gas caps from the particles. The separation of gas caps causes the particles to dislodge from the wafer surface and to be swept away by the streaming flow of the high frequency ultrasound source. Inspection of the wafer surface for cleanliness may be accomplished in the interval between pulses.

In another embodiment of the invention, a method for cleaning the surface of a wafer is accomplished by application of two ultrasonic fields to induce controlled cavitation. In this embodiment, gas caps are induced to form at the surface of a wafer where particles exist by application of a first ultrasonic field of relatively high frequency. The gas caps are then separated from the particles by application of a second ultrasonic field of relatively low frequency. The first and second ultrasonic fields are confocally applied to the surface of the wafer.

In another embodiment of the invention, an apparatus for cleaning the surface of a wafer comprises two ultrasound sources to induce controlled cavitation. In this embodiment, a first ultrasound source of relatively high frequency induces gas caps to form on particles present on the surface of the wafer. A second ultrasound source of relatively low frequency separates the gas caps from the particles. The first and second ultrasound source are applied confocally to the wafer surface.

Other objects, features and advantages of the present invention will be apparent from the description of the preferred embodiments when read in conjunction with the drawings.

BRIEF DESCRIPTION OF THE DRAWINGS

FIG. 2(c) depicts a schematic representation of a particle and two bubbles formed by separation of gas caps.

DETAILED DESCRIPTION

The present invention utilizes cavitation to clean the surface of a wafer in a liquid medium. Clean liquids do not cavitate easily. A pure liquid purged of all particulate impurities and stored in a perfectly smooth container can attain its theoretical tensile strength before undergoing cavitation or fracture. Under ideal conditions, the theoretical tensile strength of water based on the homogeneous nucleation theory exceeds 1000 bars (1 bar is approximately equal to atmospheric pressure at 15 degrees centigrade and 1 atmosphere, which is approximately equal to $10^5$ Newtons per square meter). In cavitation studies tensile strengths of liquids are often quoted in terms of negative pressures (bar peak negative). A liquid's "threshold" is understood as the pressure amplitude at which the first occurrence of cavitation is detected.

In practice, observed thresholds of clean liquids are generally lower than those theoretically possible. Rarely does the strength of even a reasonably clean liquid exceed a few bars, primarily because gas pockets exist within liquids which provide the necessary seeding for cavitation. A gas pocket is often stabilized in a crevice, either in the container wall or on a liquid-borne particle. Incomplete wetting traps gas at the root of such a crevice, stabilizing it against dissolution. Unlike a free bubble, surface tension in this case acts on a meniscus which is concave towards the liquid. Over-pressuring the liquid for sufficient duration prior to insonification can force the meniscus further into the crevice and may cause full wetting of the crevice, which then gives rise to increased thresholds.

The present invention allows the threshold at which cavitation is induced to be lowered and controlled by application of a high frequency field. The lowering of the threshold allows cavitation to be produced in a more efficient manner. The controlling of cavitation allows cavitation to be produced at a precise spot thereby allowing precise cleaning of a wafer surface.

Figure 1:
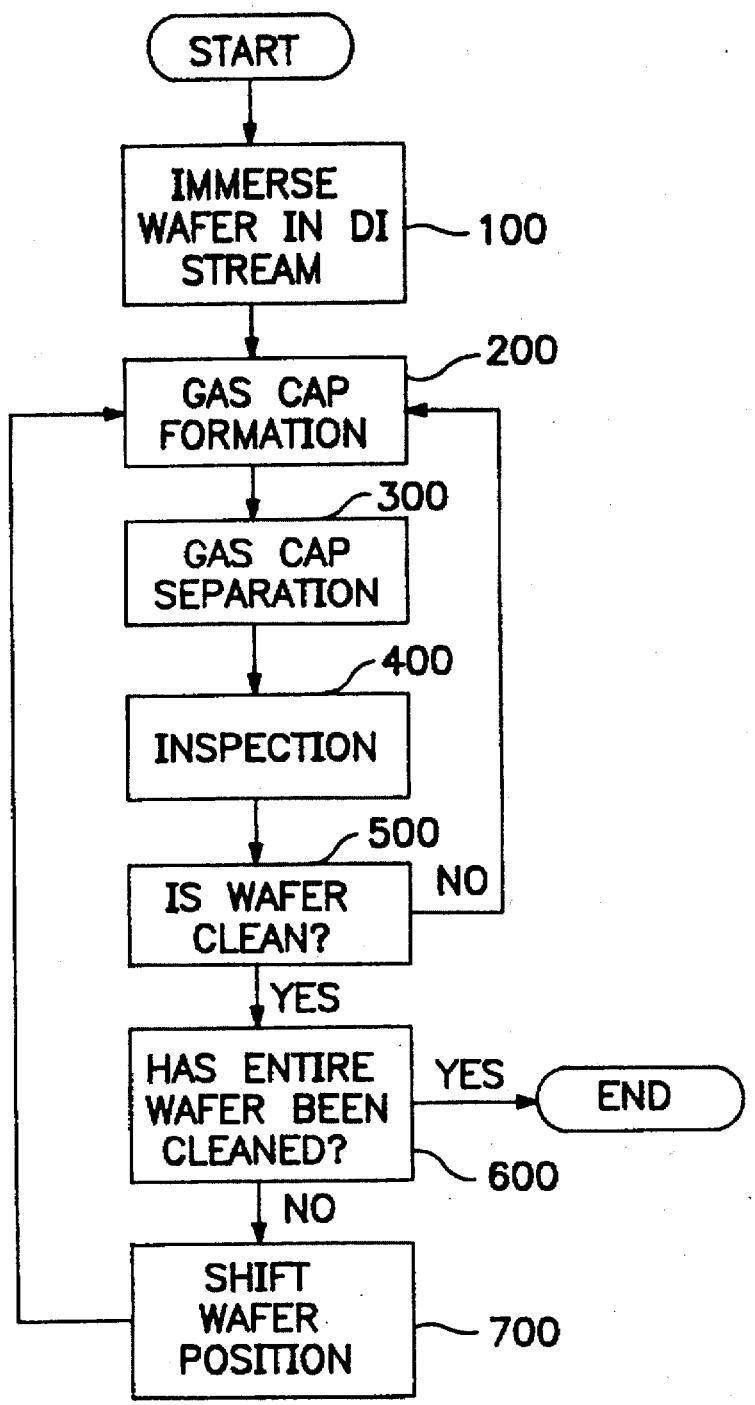
FIG. 1 depicts in flow chart form a method for simultaneous cleaning and inspection of the surface of a wafer.

FIG. 1 depicts in flow chart form a method for cleaning the surface of a wafer. The method outlined is generally one part of a wafer transfer line. In initial step 100, a wafer to be cleaned is immersed in a counter flowing stream of rinsing liquid. The rinsing liquid could be any liquid which is sufficiently pure so as not to further contaminate the wafer surface. Deionized water has an ionic purity of 18 MΩ/cm and is one example of a suitable rinsing liquid. In step 200, gas caps are formed on particles present at a specific spot on the wafer surface by focusing a first acoustic field at that spot. The spot is determined by the area of focus on the surface and is referred to as the focus spot. Gas caps formed on particles are then separated from the particles by focusing a second acoustic source at the focus spot in step 300. The two fields in steps 200 and 300 are applied confocally. The first acoustic field has a frequency which is relatively high, on the order of 30 MHz, while the second acoustic field has a lower frequency, on the order of 1 MHz. In step 400, the surface of the wafer is inspected for particulate contamination by a process such as for example pulse-echo scattering or optical inspection. In step 500, a decision is made as to whether the wafer surface at the spot is clean. If the surface at the spot is clean, then it is determined whether or not the entire surface of the wafer has been cleaned in step 600. If the entire surface of the wafer has been cleaned, the process is terminated. If the entire surface of the wafer has not been cleaned, then the position of the wafer relative to the focus spot of the acoustic fields is shifted and steps 200–500 are repeated until the entire surface has been cleaned. If in step 500 it is determined that the surface of the wafer has not been thoroughly cleaned, steps 200–400 are repeated. The individual steps will be explained in more detail with reference to FIGS. 2(a)–2(c) which represent a sequential depiction of gas cap formation and separation.

In step 100, the wafer to be cleaned is immersed in the rinsing liquid. Once immersed in the liquid, a flow is established over the surface to be cleaned. This flow provides a general rinsing of the wafer.

In step 200, a first acoustic field is applied to the surface of the wafer in order to induce the formation of gas caps on any particles present on the wafer surface. This first acoustic field preprocesses the surface of the wafer for cavitation to occur and therefore can be referred to as a "coaxing" field. Cavitation is partially responsible for the cleaning of the wafer surface (to be explained in conjunction with step 300). The first acoustic field generally has a frequency greater than 5 MHz and preferably within the range of about 5 MHz to about 80 MHz, and more preferably within the range of about 25 MHz to about 30 MHz. In one preferred embodiment the first field has a frequency of about 30 MHz and a pressure of about 0.5 bar peak negative (low pressures are recommended for the coaxing field). The first field is preferably a pulsed field of relatively low duty cycle because such a field allows inspection to be carried out substantially simultaneously with cleaning i.e., in the interval between pulses. As an example, the first field may comprise pulses of 10 microsecond duration at a frequency of 1 kHz. The first field is focused at a spot on the surface of the wafer. The fact that the source is focused allows the effect of the source to be "surgical," that is, directed at particles existing in the narrow focus spot.

The first acoustic field also has a cleaning effect due to sweeping the surface of the wafer. That is, the relatively high frequencies present in the high frequency source provide intense streaming which sweeps away particles present on the surface of the wafer. Therefore, the first acoustic field effectively has a dual purpose, inducing the formation of gas caps and sweeping particles from the surface of the wafer. This first field may also be used for a third purpose, i.e. inspection, which will be explained in conjunction with step 400.

Application of the focused high frequency field to the surface of the wafer will cause gas pockets to form on particles present on the surface at the focus spot. These pockets of gas are referred to as gas caps. Gas cap formation is made possible by the existence of very small gas dots on the surface of the particles. Solids in glass state may have smooth surfaces, and carefully cleaved crystal surfaces may be smooth initially. But, the notion of smoothness for real surfaces implies that roughness below a certain length scale is ignored. If fine length scale matters are considered, then roughness persists at some level. For instance, adsorption studies on various powder surfaces have revealed the presence of fractual surfaces at molecular levels.

Most solids, such as particles, do not have geometrically smooth surfaces. Disposed in liquid, these particles have at least microscopic surface areas of roughness. Because liquids operate to minimize surface energy which minimizes free surfaces, these microscopic areas of roughness trap gas therein, and thus, do not become wetted with liquid. These areas of roughness are primarily at the nanometer length scale, and therefore gas trapped in one of these areas of roughness is referred to as a nano-gas-dot. Nano-gas-dots may be formed by gas released in the dissolved state, vapor molecules from the host liquid, and under favorable circumstances, desorption of adsorbed nonpolar constituents. These nano-gas-dots will coalesce and grow under the influence of the high frequency field and thereby form the gas caps.

Figure 2A:
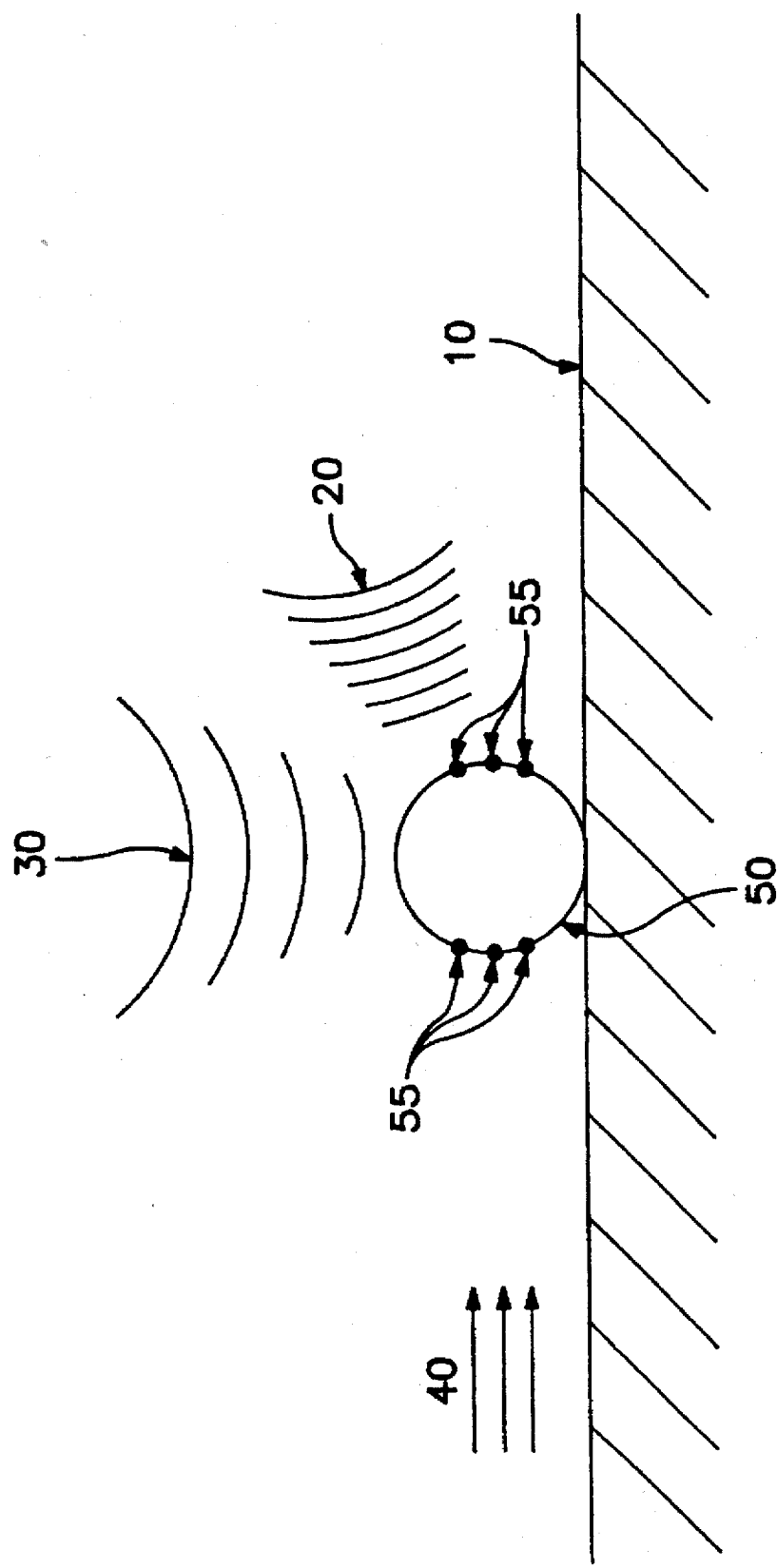
FIG. 2(a) depicts a schematic representation of a particle adhered to a wafer having nano-gas-dots disposed thereon.

Referring to FIG. 2(a), particle 50 adhered to wafer 10 is depicted as having a plurality of nano-gas-dots 55 disposed thereon. The wafer is immersed in a rinsing liquid with a flow 40 established over its surface. As discussed above, the size of nano-gas-dots 55 is very small and thus the depiction in FIG. 2(a) is disproportionate only for purposes of illustration. In FIG. 2(a), 20 and 30 represent the coaxing and cavitation fields respectively.

The density of air is generally much less than that of the liquid (a factor of 830 less for water). Therefore, nano-gas-dots 55 on the surface of particle 50, have an amplitude of oscillation greater than that of the liquid (approximately three times greater for water). This difference in amplitude of oscillation is significant because it causes the gas dots to oscillate on the surface of the particle and is one of the factors which leads to gas cap formation. That is, oscillations may cause nano-gas-dots to bridge with neighboring dots do to the attraction forces between them. Attraction forces are caused by hydrodynamic interactions between particles. For example, two pulsating hemispherical nano-gas-dots closely separated by 50 nanometers on a plane, such as a particle surface having a one micron diameter spherical shape, may coalesce as a result of the oscillations reducing the separation to a distance where mutual attraction forces dominate.

The density difference between the air and the host liquid also gives rise to nano-gas-dot coalescence and gas cap growth in another way. In the case of a free particle in a liquid, because of this density contrast, the nano-gas-dots experience a greater amount of kinetic buoyancy than the particles. Therefore, the movement of the nano-gas-dots generally leads that of the particle in response to an incident wave. This lead urges the nano-gas-dots toward the fore and aft regions of the particle and therefore increases the chances of the nano-gas-dots coalescing at the fore and aft regions. In the present situation, the fact that the particles are adhered to the surface of the wafer does not effect this coalescence.

Figure 2B:
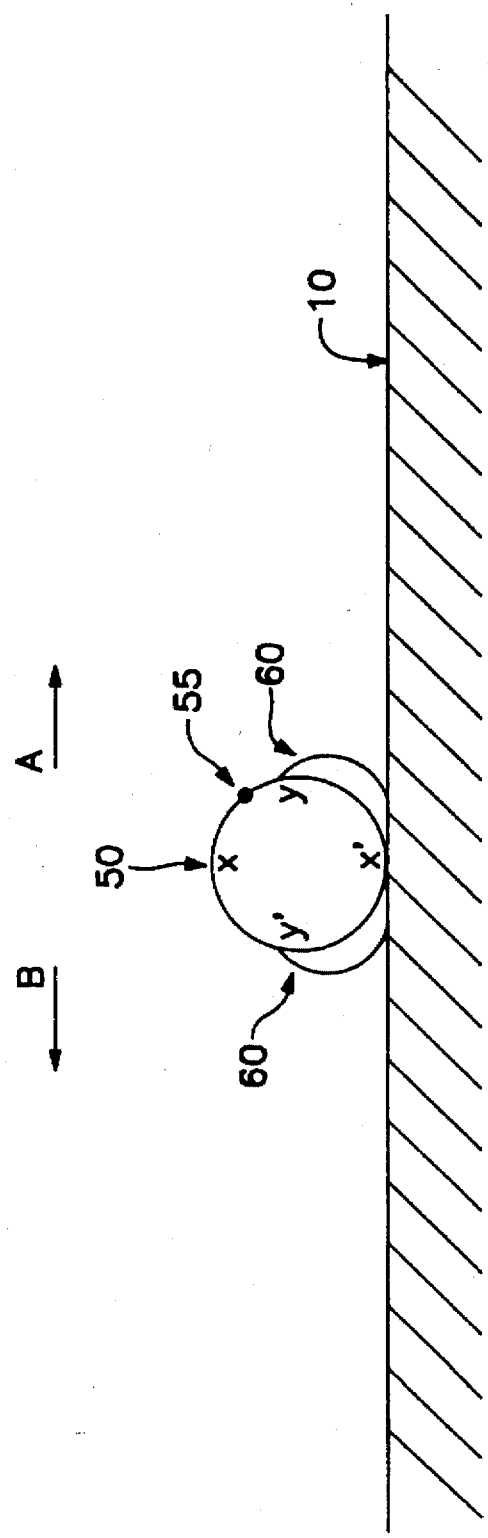
FIG. 2(b) depicts a schematic representation of a particle having gas caps formed thereon.
Figure 3:
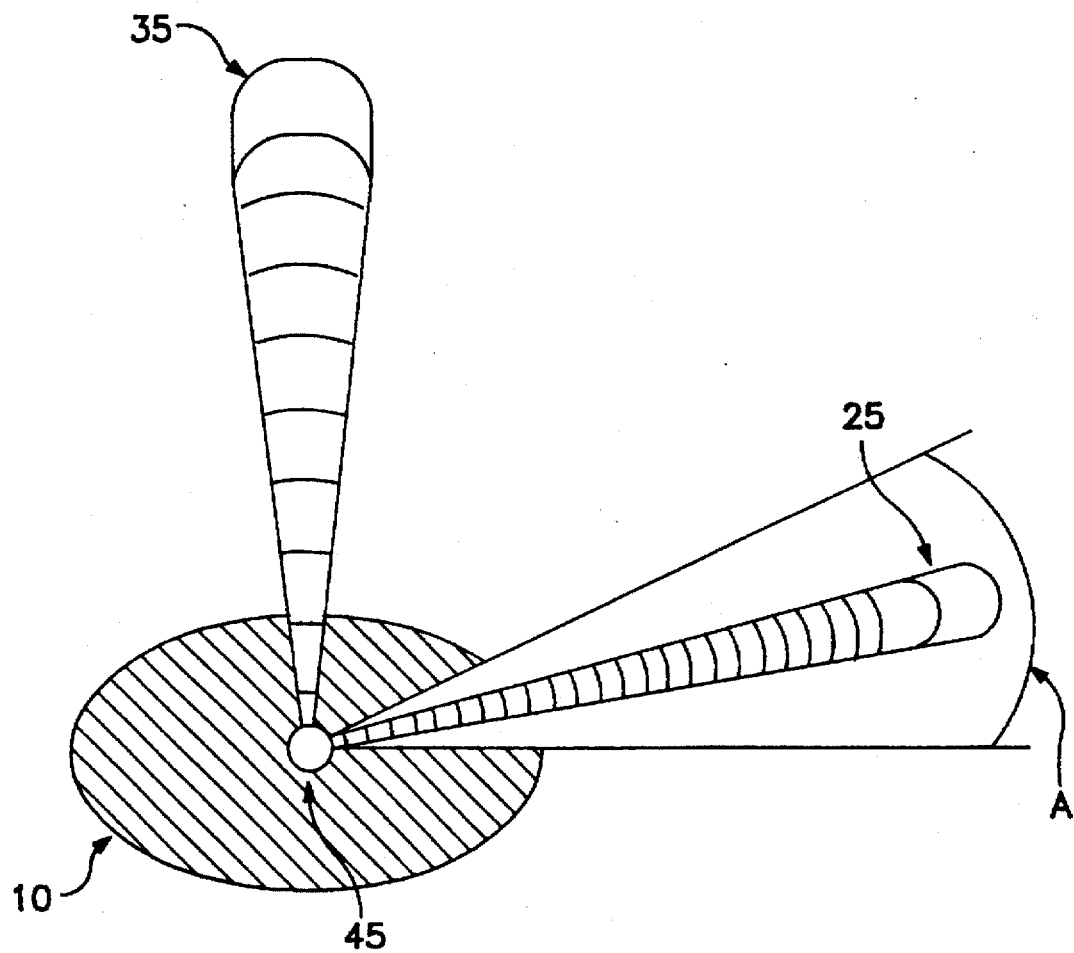
FIG. 3 depicts a schematic representation of an apparatus for simultaneous cleaning and inspection of the surface of a wafer.

An illustration of how this density difference effects gas cap coalescence can be explained with reference to FIG. 2(b). Consider a nano-gas-dot 55 midway between X and Y at approximately 30° latitude (where the YY line is the equator). The high frequency field causes this gas dot to accelerate alternately in the directions indicated by arrows A and B. During the phase of acceleration indicated by arrow A, this nano-gas-dot is free to move towards Y. During the opposite half cycle of the high pressure wave, this acceleration is reversed to the direction of arrow B. When this occurs, the nano-gas-dot encounters a material barrier due to the particle that resists the body force of the kinetic buoyancy. Under these circumstances, the nano-gas-dot is thought to be experiencing a rectified kinetic buoyancy, which promotes the agglomeration of nano-gas-dots at fore and aft regions along the axis of oscillation and the consequent formation of gas caps 60 (the gas cap 60 may be either a single gas cap surrounding the point of contact or may be plural gas caps). That is, the nano-gas-dot experiences a ratcheted motion toward Y.

The above described mechanisms explain how the high frequency field can lead to the coalescence of nano-gas-dots 55 on the surface of particle 50 at opposite poles along the axis of oscillation on particle 50. As depicted in FIG. 2(b), when a particle is adhering to a surface, gas caps will likely form in the immediate neighborhood of the point of contact. There are two reasons for this. First, because of surface tension considerations, the crevice geometry is favorable for the stabilization of a gas cap. Also, the high frequency field may be directed downward from an angle. Therefore, there may be a component of acceleration in the downward direction as well as in the direction of arrows A and B. This downward component of acceleration tends to encourage gas caps 60 to form very near the contact point.

Gas cap growth need not occur solely through coalescence. Gas caps 60 may also be enlarged due to an infusion of gas from the surrounding liquid. Acceleration due to the high frequency field (coaxing field) may cause the rinsing liquid in the vicinity of the particle to supersaturate with dissolved gas. The wedge shaped region about the point of contact of the particle with the wafer is an area conducive to gas agglomeration. Therefore, if the dissolved gas should separate from the liquid, it may agglomerate in the region around this point of contact. In this way dissolved gas from the liquid may be transferred into the gas caps. This transfer leads to further enlargement of the gas caps 60.

Gas caps 60 tend to have a crescent or pierced toroid shape due to the tensile field around the particle. Gas caps 60 may also be partially vaporous even though nano-gas-dots 55 are unlikely to contain significant amounts of vapor. Gas caps 60 maintain contact with particle 50 due to surface tension. This surface tension is generally strong enough to maintain contact with gas caps 60 up to a critical gas cap size. To separate a gas cap from the particle, the tensile pressure on the gas cap due to the acoustic wave must overcome surface tension resistance along the perimeter of contact. The peak negative pressure amplitude causing this separation is the cavitation threshold. By causing the gas caps to form and grow on the surface of a particle, the cavitation threshold is thus lowered. When separation occurs, gas caps 60 break away from particle 50 to form bubbles 70 as shown in FIG. 2(c).

The application of the high frequency field will not alone cause cavitation to occur. One reason is that, the high frequency field does not provide sufficient time for bubble growth. Additionally, the high frequency field is not of sufficient tensile pressure to overcome the surface tension effects and separate a gas cap from a particle or to cause collapse of the bubble. Note that these factors all relate to the size of the bubble. A brief analysis may help explain this. Although gas caps 60 are not perfect bubbles, because only minor differences in analysis exist between partial bubbles and bubbles, gas caps 60 may be analyzed as bubbles.

Every bubble has a radius at which forces tending to expand the bubble overcome forces trying to collapse the bubble. At that radius, known as the critical radius, the bubble experiences unbounded increase in size until it fractures. The Blake threshold is the acoustic pressure amplitude that causes the bubble radius to expand beyond the critical radius. The equation for the Blake threshold is given below:

$$R_c = \frac{4}{3} \frac{\sigma}{p_v - p_{lc}} \quad (1)$$

where $R_c$ is the critical radius, $\sigma$ is the surface tension of the water, $p_v$ is the pressure of the vapor in the bubble, and $P_{lc}$ is the acoustic pressure of the surrounding liquid. Assume that for the gas caps forming on particles in a liquid, the size of the gas cap can be approximated by the size of the particle. In this case, for particles having diameters of 0.984 μm, 0.481 μm, and 0.245 μm, the Blake thresholds are 1.96, 3.1 and 5.3 bar peak negative, respectively. Therefore, not only does a high frequency acoustic field not afford enough time for significant bubble growth (because the high and low pressure portions are of short duration), but the maximum pressure amplitude available in the high frequency acoustic field used in step 200 of about 0.5 bar peak negative is well below the Blake threshold value necessary to cause unbounded growth in the gas caps. The assumption that gas cap size is the same as particle size is actually a conservative assumption in this case because gas cap size is unlikely to be greater than particle size and a smaller gas cap size would yield a greater Blake threshold.

It can be seen from this analysis that the high frequency acoustic field preprocesses the particles for cavitation by engendering the formation of gas caps and thereby lowering the cavitation threshold. The high frequency field is not able to wrench off the gas caps because the gas caps do not grow to a size large enough for the relatively low pressure available in the high frequency field to overcome the surface tension on the particle. Therefore, in step 300, a cavitation field is used to focus a stronger tensile pressure toward the particles to cause the gas caps to reach the critical radius and thus separate from the particle.

In step 300 of FIG. 1, the particles are subjected to a cavitation field in order to separate gas caps 60 from particle 50 to form bubbles 70, shown in FIG. 2(c). The cavitation field is a relatively low frequency field (compared to the high frequency field). The cavitation field may have a frequency less than about 5 MHz and preferably within the range of about 0.5 MHz to about 3 MHz and more preferably within the range of about 0.75 MHz to about 1 MHz. In one preferred embodiment the cavitation field may have a frequency of about 1 MHz. The cavitation field is applied with a tensile pressure appropriate for overcoming the cavitation threshold. This tensile pressure could be as low as 5 bar peak negative and is preferably within the range of 5-7 bars peak negative. Similar to the first acoustic field, the cavitation field may also be a pulse field of relatively low duty cycle. The cavitation field will generally be applied with a similar pulse duration and frequency as the first acoustic field.

The steps 200 and 300 are shown in series in FIG. 1 for purposes of illustration. In operation the timing of steps 200 and 300 is such that the cavitation field is applied while the gas caps are still agglomerated on the particle. After some amount of time, the gas caps may dissipate back to nano-gas-dots. The exact amount of time will depend on the specifics of the application. Therefore, the two fields can be applied sequentially or with a slight delay between their application (with the coaxing field applied first). In a preferred embodiment the high and low frequency fields are pulsed fields whose pulses are applied substantially simultaneously and confocally to the surface of the wafer. This confocal arrangement gives rise to a focus spot of a defined size on the surface of the wafer. The focus spot is the area in which the surgical cleaning will take place.

In step 400 the wafer surface is inspected. This inspection is carried out by a process such as for example pulse-echo scattering or optical inspection in the interval between pulses of the acoustic fields. If pulse-echo scattering is used, The high frequency field can be controlled such that it may be used for inspection also. That is, pulses of the high frequency field would be used for pulse-echo scattering. Alternatively, a third acoustic field may be used to accomplish inspection by pulse echo scattering.

Referring to FIG. 2(c), when the cavitation field is of sufficient tensile pressure to overcome the surface tension on the particle, bubbles 70 separate from particle 50 in liquid stream 40. The very presence of the bubbles is sufficient to detect particles based upon scattered sound. These bubbles, like any other component, reflect sound waves and create an echo which may be detected in step 400. The acoustic signature of the bubbles is about 80 dB greater than the acoustic signature of the particles and thus detection of the acoustic signature due to sound wave echo becomes possible. The echo signal is generally received and displayed on an oscilloscope. The existence of a spike in the echo signal with a magnitude greater than a level normally attributable to noise may indicate the presence of one or more bubble.

In step 500, it is determined whether or not the wafer surface is clean at the focus spot using the results of the inspection step 400. If the echo signal indicates the presence of bubbles, the wafer surface at the focus spot is not yet clean. In this case, the steps 200–400 are repeated until the echo signal received in step 400 from the pulse-echo scattering indicates no bubbles are present and therefore that the surface is clean.

If the surface of the wafer at the focus spot is judged to be clean in step 500, then in step 600 it will be judged whether or not the entire wafer surface has been cleaned. If the entire surface of the wafer has been cleaned the process is complete. If in step 600 it is determined that the entire surface of the wafer has not been cleaned, the position of the focus spot on the surface of the wafer will be changed to the next position. This can be performed in a variety of ways. For example, the focus spot of the sources of the high frequency and cavitation fields may be adjusted so it lies at a different portion of the wafer. Alternatively, the position of the wafer may be shifted so that the focus spot lies on a different portion of the wafer. In either case, the effect is the same, the focus spot lies on a different portion of the wafer so that a new spot is cleaned. In some cases it may be easier to move the wafer because, as mentioned above, the wafer is likely to be undergoing this cleaning process as part of a wafer transfer line where the wafer is transferred from station to station for different processing steps. The position shifting generally takes place in an ordered fashion such as in a raster-type scan where the surface area of the wafer is effectively divided into rows and columns of size determined by the size of the focus spot. The position shifting would then take place row by row until the entire surface of the wafer has been cleaned.

The method of FIG. 1 makes it possible to combine the advantages of controlled cavitation with those of intense streaming fields for surgically cleaning particles from the surface of a wafer, including submicron particles. As the method can be operated in a tone-burst mode at low duty cycles, it provides for simultaneous, interleaving inspection of the wafer between the tone-bursts-scope and thereby enhances productivity by obviating any additional inspection steps in the processing sequence. The method uses a combination of cavitation and streaming to achieve controlled "micro-cleaning." Due to the concentrated effects of pinpoint cavitation and high acceleration sweeping, this method should be effective even for submicron sized particles adhering to the wafer surface. The length scales involved are 1.5 mm and 50 µm at 1 MHz and 30 MHz respectively (compared with 7.5 cm at 20 kHz used in prior art ultrasonic cleaning), which allows the method to be effective for submicron sized particles. For uniform cleaning effectiveness the cleaning zone (defined by the focus spot) should be comparable to, or smaller than the wavelength of sound used. Longer wavelengths are not effective at interacting with smaller particles. The exact frequencies used in the above method may be adjusted for specific applications.

Alternatively, the method explained above could be modified so that cleaning and inspection are not simultaneous. The inspection steps are not essential to the cleaning and therefore could be carried out after the entire wafer surface has been cleaned as discussed with respect to steps 200 and 300 of FIG. 1.

An apparatus for cleaning the surface of a wafer is shown in FIG. 4 and includes a container (not shown) for immersing the wafer in the rinsing liquid. The precise structure of the container is not critical and can be any defined space such as a vessel, tank, etc. in which it is possible to immerse the wafer 10 in the liquid and to establish the flow of the liquid over the wafer surface. The apparatus may also include first and second ultrasonic sources 25 and 35 for producing the high frequency or coaxing field and the cavitation field respectively. The first ultrasonic source 25 for producing the coaxing field is preferably an active transducer operating at a frequency above about 5 MHz and preferably within the range of about 5 MHz to about 80 MHz and more preferably within the range of about 25 MHz to about 30 MHz. In one preferred embodiment the first source will operate at a frequency of about 30 MHz. The first source will operate with a relatively low pressure on the order of 0.5 bar peak negative. Source 25 could be any active transducer capable of operating at the specified frequency and pressure including but not limited to a Lithium Niaobate transducer. Source 25 is arranged to be directed at the wafer surface from an angle of between 0 and 25 degrees from the surface of the wafer. Angle A in FIG. 4 represents the range of positions through which the source may be moved.

First source 25 also accomplishes inspection of the wafer. The transducer which comprises source 25 may be connected to receive echo signals which may then be displayed on an oscilloscope (not shown). Detection of anomalies in the echo signal would then be carried out as explained above with respect to step 400 of the method of FIG. 1.

Alternatively, a third transducer (not shown) may be employed to accomplish inspection of the wafer surface. This would allow inspection to be carried out at a third frequency, different from the frequencies' of the first and second transducers. An optical inspection system (not shown) could also be used to accomplish inspection of the wafer surface.

Second source 35 is the cavitation source and will produce an ultrasonic field with a frequency below about 5 MHz and preferably within the range of about 0.5 MHz to about 3 MHz and more preferably within the range of about 0.75 MHz to about 1 MHz. In a specific embodiment the cavitation source is a transducer operating at a frequency of about 1 MHz. As explained above, the cavitation field is applied with a pressure which is suitable to induce cavitation. The cavitation source could be any transducer such as for example an LZT-1, PZT-5, etc. The second ultrasound source is arranged to be confocal with the first ultrasound source at a focus spot 45 as explained above with reference to steps 200 and 300 of the method of FIG. 1.

The first and second transducers may operate in a pulse or continuous mode. Further, the first and second sources are arranged to operate so that the gas caps are formed by the first source and then separated by the second source. That is, the first and second source may operate so that the first and second fields are sequential with a short or no delay between the fields, and preferably operate so the fields are simultaneous.

In FIG. 4, the confocal arrangement of the cavitation source and the coaxing source will lead to controlled cavitation at the surface of the wafer where particles exist. The cavitation produced will loosen the particles (including submicronic particles) from the wafer surface so that they can be swept away by the intense streaming of the high frequency field thereby micro-cleaning the wafer surface.

Although a detailed description of the present invention has been provided, it should be understood that the scope of the invention is not to be limited thereby, but is to be determined by the claims which follow. Various modifications and alternatives will be readily apparent to one of ordinary skill in the art.

I claim:

1. A method for simultaneous cleaning and inspection of a surface of a wafer comprising:

exposing the surface of the wafer to a rinsing liquid;

inducing cavitation at particle sites within a portion of the surface of the wafer thereby removing particles from said portion of said surface, wherein inducing cavitation comprises;

directing a first acoustic field at the portion of the surface, said first acoustic field having a frequency of sufficient magnitude to induce nano-gas-dots to form gas caps at said particle sites;

substantially simultaneously directing a second acoustic field at the portion of the surface, said first acoustic field having a frequency greater than a frequency of the second acoustic field, said second acoustic field having a tensile pressure sufficient to separate gas caps formed at said particle sites from the surface of the wafer; and, inspecting said portion of the surface of the wafer substantially simultaneously with inducing cavitation by detecting acoustic signals generated by said cavitation.

2. The method of claim 1 wherein the step of inducing cavitation comprises:

forming gas caps on particles residing on the surface of the wafer; and, separating said gas caps from said particles;

whereby separating said gas caps from said particles dislodges said particles from the surface of the wafer.

3. The method of claim 1 wherein directing said first acoustic field comprises:

generating said first acoustic field having a frequency greater than about 5 MHz; and focusing said first acoustic field on said portion of the surface of the wafer.

4. The method of claim 3 wherein directing said first acoustic field further comprises:

directing said first acoustic field toward the surface of the wafer at an angle between about 0° to about 25° to the surface of the wafer.

5. The method of claim 3 wherein the first acoustic field has a frequency between about 5 MHz to about 80 MHz.

6. The method of claim 3 wherein directing said second acoustic field comprises:

generating said second acoustic field having a frequency less than about 5 MHz; and, focusing said second acoustic field on said portion of the surface of the wafer.

7. The method of claim 6 wherein directing said second acoustic field further comprises:

directing said second acoustic field toward the surface of the wafer at an angle substantially perpendicular to the surface of the wafer.

8. The method of claim 6 wherein the second acoustic field has a frequency between about 0.5 MHz to about 3 MHz.

9. The method of claim 6 wherein the first acoustic field and the second acoustic field comprise pulse acoustic fields.

10. The method of claim 9 wherein inspecting is performed in an interval between pulses of the first and second fields.

11. A method for cleaning of a surface of a wafer comprising:

exposing the surface of the wafer to a rinsing liquid; and, inducing cavitation at particle sites within a portion of the surface of the wafer thereby removing particles from said portion of said surface, wherein inducing cavitation comprises;

directing a first acoustic field at the portion of the surface, said first acoustic field having a frequency of sufficient magnitude to induce nano-gas-dots to form gas caps at said particle sites; and, substantially simultaneously directing a second acoustic field at the portion of the surface, said first acoustic field having a frequency greater than a frequency of the second acoustic field, said second acoustic field having a tensile pressure sufficient to separate gas caps formed at said particle sites from the surface of the wafer.

12. The method of claim 11 wherein the step of inducing cavitation comprises:

forming gas caps on particles residing on the surface of the wafer; and, separating said gas caps form said particles;

whereby separating said gas caps from said particles dislodges said particles from the surface of the wafer.

13. The method of claim 11 wherein directing said first acoustic field comprises:

generating said first acoustic field having a frequency greater than about 5 MHz; and focusing said first acoustic field on the portion of the surface of the wafer.

14. The method of claim 13 wherein directing said first acoustic field further comprises:

directing said first acoustic field toward the surface of the wafer at an angle between about 0° to about 25° to the surface of the wafer.

15. The method of claim 13 wherein the first acoustic field has a frequency between about 5 MHz to about 80 MHz.

16. The method of claim 11 wherein directing said second acoustic field comprises:

generating said second acoustic field having a frequency less than about 5 MHz; and, focusing said second acoustic field on a portion of the surface of the wafer.

17. The method of claim 16 wherein directing said second acoustic field further comprises:

directing said second acoustic field toward the surface of the wafer at an angle substantially perpendicular to the surface of the wafer.

18. The method of claim 16 wherein the second acoustic field has a frequency between about 0.5 MHz to about 3 MHz.

* * * * *